(12) United States Patent
Lin

(10) Patent No.: US 11,271,551 B2
(45) Date of Patent: Mar. 8, 2022

(54) LEVEL SHIFTER

(71) Applicant: eMemory Technology Inc., Hsin-Chu (TW)

(72) Inventor: Huan-Min Lin, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 17/317,932

(22) Filed: May 12, 2021

(65) Prior Publication Data

US 2022/0021377 A1 Jan. 20, 2022

Related U.S. Application Data

(60) Provisional application No. 63/051,879, filed on Jul. 14, 2020.

(51) Int. Cl.
*H03L 5/00* (2006.01)
*H03K 3/037* (2006.01)
*H03K 19/20* (2006.01)

(52) U.S. Cl.
CPC ............ *H03K 3/037* (2013.01); *H03K 19/20* (2013.01)

(58) Field of Classification Search
CPC ..... H03K 19/018521; H03K 3/356113; H03K 19/00315; H03K 17/102; H03K 3/01
USPC .......................................................... 327/333
See application file for complete search history.

(56) References Cited

U.S. PATENT DOCUMENTS

| 6,414,534 | B1* | 7/2002 | Wang ................. H03K 3/012 326/68 |
| 7,307,454 | B1 | 12/2007 | Wert |
| 7,675,345 | B2 | 3/2010 | Fayed |
| 8,063,662 | B2 | 11/2011 | Foley et al. |
| 9,088,268 | B2 | 7/2015 | Mazumder |
| 2018/0097519 | A1* | 4/2018 | Peng ............. H03K 19/018521 |

* cited by examiner

*Primary Examiner* — Quan Tra
(74) *Attorney, Agent, or Firm* — WPAT, PC

(57) ABSTRACT

A level shifter includes a self-initialization circuit. The self-initialization circuit judges whether the input signal and the inverted input signal received by the level shifter are invalid while a power supply voltage is powered up. If the self-initialization circuit confirms that the input signal and the inverted input signal received by the level shifter are invalid, the self-initialization circuit controls the level shifter to be maintained in a self-initializing power up state. Consequently, the output signal from the level shifter has the specified voltage level.

6 Claims, 3 Drawing Sheets

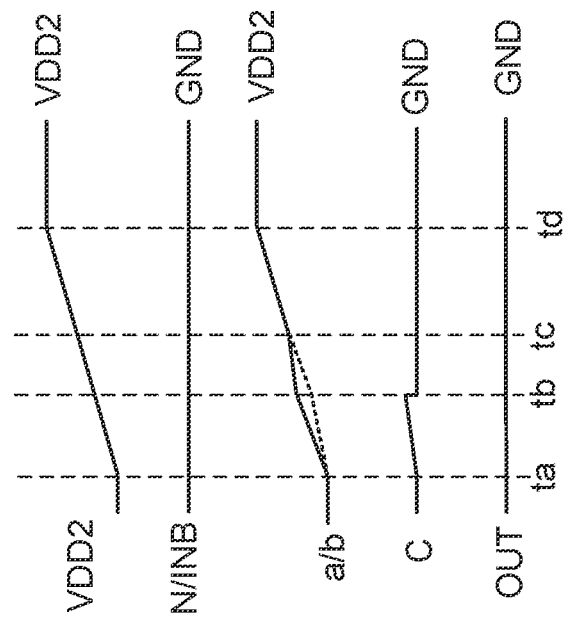
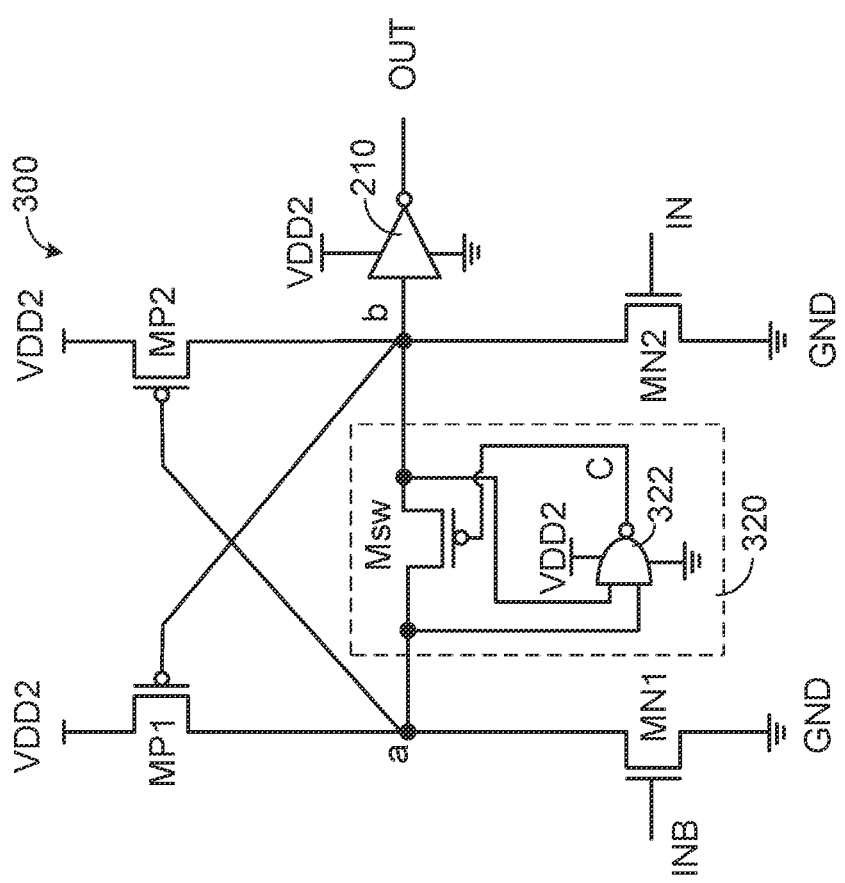
FIG. 3A
FIG. 3B

LEVEL SHIFTER

This application claims the benefit of U.S. provisional application Ser. No. 63/051,879, filed Jul. 14, 2020, the subject matter of which is incorporated herein by reference.

FIELD OF THE INVENTION

The present invention relates to a level shifter, and more particularly to a level shifter capable of enabling a self-initializing power up state.

BACKGROUND OF THE INVENTION

A level shifter is used for converting a narrow-range input signal into a wide-range output signal. Consequently, the level shifter is an important building block of an interface circuit. For example, in an IC chip, a level shifter is used to convert a core voltage of a specified signal into an input/output signal (IO voltage). Generally, the core voltage is in the range between 0 and 0.8 volts, and the IO voltage is in the range between 0 and 1.5 volts. For converting the input signal into the output signal, the level shifter is needed. For example, the input signal in the range between 0 and 0.8 volts is converted into the output signal in the range between 0 and 1.5 volts by the level shifter.

FIG. 1A is a schematic circuit diagram illustrating a conventional level shifter. The level shifter 10 is used for converting an input signal IN and an inverted input signal INB (in the range between the voltage VDD1 and the voltage GND) into an output signal OUT (in the range between the voltage VDD2 and the voltage GND). The voltage VDD1 is a power supply voltage (e.g., 1.5V), the voltage VDD2 is another power supply voltage, and the voltage GND is a ground voltage (e.g., 0V). The power supply voltage VDD2 is higher than the power supply voltage VDD1, and the power supply voltage VDD1 is higher than the ground voltage GND.

As shown in FIG. 1A, the level shifter 10 comprises a first P-type transistor MP1, a second P-type transistor MP2, a first N-type transistor MN1, a second N-type transistor MN2 and a NOT gate 12.

The source terminal of the first P-type transistor MP1 receives the power supply voltage VDD2. The drain terminal of the first P-type transistor MP1 is connected with a node a. The gate terminal of the first P-type transistor MP1 is connected with a node b. The source terminal of the second P-type transistor MP2 receives the power supply voltage VDD2. The drain terminal of the second P-type transistor MP2 is connected with the node b. The gate terminal of the second P-type transistor MP2 is connected with the node a.

The drain terminal of the first N-type transistor MN1 is connected with the node a. The source terminal of the first N-type transistor MN1 receives the ground voltage GND. The gate terminal of the first N-type transistor MN1 receives the inverted input signal INB. The drain terminal of the second N-type transistor MN2 is connected with the node b. The source terminal of the second N-type transistor MN2 receives the ground voltage GND. The gate terminal of the second N-type transistor MN2 receives the input signal IN.

The NOT gate 12 receives the power supply voltage VDD2. The input terminal of the NOT gate 12 is connected with the node b. The output terminal of the NOT gate 12 is used as the output terminal of the level shifter 10 to generate an output signal OUT. Alternatively, the level shifter 10 may further comprises an additional NOT gate (not shown). The input terminal of the additional NOT gate is connected with the node a. The output terminal of the additional NOT gate generates an inverted output signal OUTB (not shown).

FIG. 1B is a schematic timing waveform diagram illustrating associated signal processed by the conventional level shifter in a normal working state.

At the time point t1, the input signal IN of the level shifter 10 is in the high level state corresponding to the power supply voltage VDD1, and the inverted input signal INB is in the low level state corresponding to the ground voltage GND. Meanwhile, the second N-type transistor MN2 and the first P-type transistor MP1 are turned on, and the first N-type transistor MN1 and the second P-type transistor MP2 are turned off. Consequently, the voltage at the node b is equal to the ground voltage GND, and the output signal OUT from the NOT gate 12 is in the high level state corresponding to the power supply voltage VDD2.

At the time point t2, the input signal IN of the level shifter 10 is in the low level state corresponding to the ground voltage GND, and the inverted input signal INB is in the high level state corresponding to the power supply voltage VDD1. Meanwhile, the second N-type transistor MN2 and the first P-type transistor MP1 are turned off, and the first N-type transistor MN1 and the second P-type transistor MP2 are turned on. Consequently, the voltage at the node b is equal to the power supply voltage VDD2, and the output signal OUT from the NOT gate 12 is in the low level state corresponding to the ground voltage GND.

Generally, after the power supply voltage VDD2 is stable, the level shifter 10 is in the normal working state. However, while the power supply voltage VDD2 of the level shifter 10 is powered up, the invalid input may cause an unknown output problem. For example, if the voltage levels of the input signal IN and the inverted input signal INB are very low, the input signal IN and the inverted input signal INB may be considered as invalid inputs.

FIG. 1C is a schematic timing waveform diagram illustrating associated signal processed by the conventional level shifter while the power supply voltage VDD2 is powered up. While the power supply voltage VDD2 is powered up, the level shifter 10 receives the invalid input signal IN and the invalid inverted input signal INB.

In the time interval between the time point to and the time point tb, the level shifter 10 is in a power up state, and the power supply voltage VDD2 is gradually increased. Since the input signal IN and the inverted input signal INB are equal to the ground voltage GND, the first N-type transistor MN1 and the second N-type transistor MN2 are turned off. Meanwhile, the charge currents generated by the first P-type transistor MP1 and the second P-type transistor MP2 charge the node a and the node b. Consequently, the voltages at the node a and the node b are gradually increased. Since the magnitudes of the charge currents generated by the first P-type transistor MP1 and the second P-type transistor MP2 are unknown, the output signal OUT is also unknown.

For example, if the magnitude of the charge current generated by the first P-type transistor MP1 is larger than the magnitude of the charge current generated by the second P-type transistor MP2, the voltage rise rate at the node a is larger than the voltage rise rate at the node b. In FIG. 1C, the solid curve denotes the voltage change at the node a, and the dotted curve denotes the voltage change at the node b. When the voltage at node a is raised to a predetermined level, the second P-type transistor MP2 is cut off and voltage at the node b stops increasing. Since the NOT gate 12 is connected with the node b, the voltage at the node b may be considered as the low voltage level. Consequently, the output signal OUT is gradually increased along the dotted curve. At the time point tb, the output signal OUT is increased to the power supply voltage VDD2, which is considered as the high voltage level.

Whereas, if the magnitude of the charge current generated by the second P-type transistor MP2 is larger than the magnitude of the charge current generated by the first P-type transistor MP1, the voltage rise rate at the node b is larger than the voltage rise rate at the node a. In FIG. 10, the solid curve denotes the voltage change at the node b, and the dotted curve denotes the voltage change at the node a. When the voltage at node b is raised to a predetermined level, the first P-type transistor MP1 is cut off and voltage at the node a stops increasing. Since the NOT gate 12 is connected with the node b, the voltage at the node b may be considered as the high voltage level. Consequently, the output signal OUT is maintained at the ground voltage GND along the dotted curve. At the time point tb, the output signal OUT is maintained at the ground voltage GND, i.e., the low voltage level.

As mentioned above, if the input signal IN and the inverted input signal INB are invalid when the level shifter 10 is in the power up state, it is unable to know whether the output signal OUT is the power supply voltage VDD2 corresponding to the high level state or the ground voltage GND corresponding to the low level state.

SUMMARY OF THE INVENTION

An embodiment of the present invention provides a level shifter for converting an input signal and an inverted input signal into an output signal. The input signal and the inverted input signal are in a range between a first power supply voltage and a ground voltage. The output signal is in a range between a second power supply voltage and the ground voltage. The level shifter includes a first P-type transistor, a second P-type transistor, a first N-type transistor, a second N-type transistor, a first NOT gate and a self-initialization circuit. A source terminal of the first P-type transistor receives the second power supply voltage. A drain terminal of the first P-type transistor is connected with a first node. A gate terminal of the first P-type transistor is connected with a second node. A source terminal of the second P-type transistor receives the second power supply voltage. A drain terminal of the second P-type transistor is connected with the second node. A gate terminal of the second P-type transistor is connected with the first node. A drain terminal of the first N-type transistor is connected with the first node. A source terminal of the first N-type transistor receives the ground voltage. A gate terminal of the first N-type transistor receives the inverted input signal. A drain terminal of the second N-type transistor is connected with the second node. A source terminal of the second N-type transistor receives the ground voltage. A gate terminal of the second N-type transistor receives the input signal. An input terminal of the first NOT gate is connected with the second node. An output terminal of the first NOT gate generate the output signal. The self-initialization circuit is connected between the first node and the second node. The self-initialization circuit judges whether the input signal and the inverted input signal received by the level shifter are invalid according to a voltage at the first node and a voltage at the second node. If the self-initialization circuit confirms that the input signal and the inverted input signal received by the level shifter are invalid, the first node and the second node are connected with each other under control of the self-initialization circuit, so that the output signal from the first NOT gate has a specified voltage level.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 3A is a schematic circuit diagram illustrating a level shifter according to a second embodiment of the present invention; and FIG. 3B is a schematic timing waveform diagram illustrating associated signal processed by the level shifter of FIG. 3A while the power supply voltage VDD2 is powered up.

DETAILED DESCRIPTION OF PREFERRED EMBODIMENTS

Figure 2:
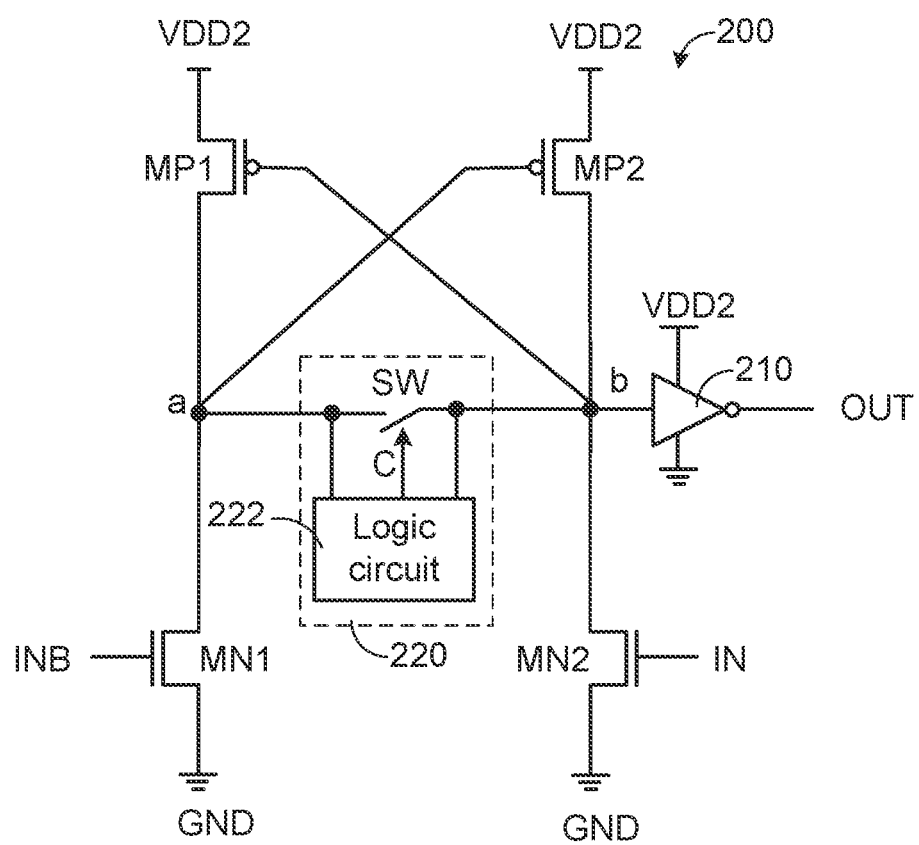
FIG. 2 is a schematic circuit diagram illustrating a level shifter according to a first embodiment of the present invention.

FIG. 2 is a schematic circuit diagram illustrating a level shifter according to a first embodiment of the present invention. The level shifter 200 is used for converting an input signal IN and an inverted input signal INB (in the range between the voltage VDD1 and the voltage GND) into an output signal OUT (in the range between the voltage VDD2 and the voltage GND). The voltage VDD1 is a power supply voltage (e.g., 0.8V), the voltage VDD2 is another power supply voltage (e.g., 1.5V), and the voltage GND is a ground voltage (e.g., 0V). The power supply voltage VDD2 is higher than the power supply voltage VDD1, and the power supply voltage VDD1 is higher than the ground voltage GND.

As shown in FIG. 2, the level shifter 200 comprises a first P-type transistor MP1, a second P-type transistor MP2, a first N-type transistor MN1, a second N-type transistor MN2, a NOT gate 210 and a self-initialization circuit 220.

The source terminal of the first P-type transistor MP1 receives the power supply voltage VDD2. The drain terminal of the first P-type transistor MP1 is connected with a node a. The gate terminal of the first P-type transistor MP1 is connected with a node b. The source terminal of the second P-type transistor MP2 receives the power supply voltage VDD2. The drain terminal of the second P-type transistor MP2 is connected with the node b. The gate terminal of the second P-type transistor MP2 is connected with the node a.

The drain terminal of the first N-type transistor MN1 is connected with the node a. The source terminal of the first N-type transistor MN1 receives the ground voltage GND. The gate terminal of the first N-type transistor MN1 receives the inverted input signal INB. The drain terminal of the second N-type transistor MN2 is connected with the node b. The source terminal of the second N-type transistor MN2 receives the ground voltage GND. The gate terminal of the second N-type transistor MN2 receives the input signal IN.

The NOT gate 210 receives the power supply voltage VDD2. The input terminal of the NOT gate 210 is connected with the node b. The output terminal of the NOT gate 210 is used as the output terminal of the level shifter 200 to generate an output signal OUT. Alternatively, the level shifter 200 may further comprises an additional NOT gate (not shown). The input terminal of the additional NOT gate is connected with the node a. The output terminal of the additional NOT gate generates an inverted output signal OUTB (not shown).

The self-initialization circuit 220 is connected between the node a and the node b. In an embodiment, the self-initialization circuit 220 comprises a switch element SW and a logic circuit 222. A first terminal of the switch element SW is connected with the node a. A second terminal of the switch element SW is connected with the node b. A control terminal of the switch element SW receives a control signal C. A first input terminal of the logic circuit 222 is connected with the node a. A second input terminal of the logic circuit 222 is connected with the node b. An output terminal of the logic circuit 222 generates the control signal C.

In the power up state, the self-initialization circuit 220 judges whether the level shifter 200 receives the invalid input signal IN and the invalid inverted input signal INB according to the voltages at the nodes a and b. If the logic circuit 222 of the self-initialization circuit 220 confirms that the level shifter 200 receives the invalid input signal IN and the invalid inverted input signal INB, the logic circuit 222 activates the control signal C. According to the control signal C, the switch element SW is changed from an off state to an on state. Meanwhile, the node a and the node b are connected with each other. Since the voltage at the node a and the voltage at the node b are equal, the NOT gate 210 generates a specified voltage level.

For example, if the logic circuit 222 of the self-initialization circuit 220 confirms that the level shifter 200 receives the invalid input signal IN and the invalid inverted input signal INB while the power supply voltage VDD2 is powered up, the control signal C is activated and the switch element SW is in the on state. Consequently, the voltage at the node a and the voltage at the node b are equal. In addition, the voltage at the node a and the voltage at the node b are increased to the power supply voltage VDD2. Consequently, the NOT gate 210 generates an output signal OUT at the ground voltage GND corresponding to the low level state.

FIG. 3A is a schematic circuit diagram illustrating a level shifter according to a second embodiment of the present invention. In comparison with the first embodiment, the circuitry structure of the self-initialization circuit 320 of the level shifter 300 in this embodiment is distinguished. For succinctness, only the self-initialization circuit 320 of the level shifter 300 will be described.

The self-initialization circuit 320 is connected between the node a and the node b. The self-initialization circuit 320 comprises a switch element and a logic circuit. The switch element is a switching transistor Msw. The logic circuit is a NAND gate 322. The NAND gate 322 receives the power supply voltage VDD2.

The first drain/source terminal of the switching transistor Msw is connected with the node a. The second drain/source terminal of the switching transistor Msw is connected with the node b. The gate terminal of the switching transistor Msw receives the control signal C. The first input terminal of the NAND gate 322 is connected with the node a. The second input terminal of the NAND gate 322 is connected with the node b. The output terminal of the NAND gate 322 generates the control signal C.

FIG. 3B is a schematic timing waveform diagram illustrating associated signal processed by the level shifter of FIG. 3A while the power supply voltage VDD2 is powered up. While the power supply voltage VDD2 is powered up, the level shifter 300 receives the invalid input signal IN and the invalid inverted input signal INB.

In the time interval between the time point to and the time point td, the level shifter 10 is in a power up state, and the power supply voltage VDD2 is gradually increased. Since the input signal IN and the inverted input signal INB are equal to the ground voltage GND, the first N-type transistor MN1 and the second N-type transistor MN2 are turned off. Meanwhile, the charge currents generated by the first P-type transistor MP1 and the second P-type transistor MP2 charge the node a and the node b. Consequently, the voltages at the node a and the node b are gradually increased. Since the magnitudes of the charge currents generated by the first P-type transistor MP1 and the second P-type transistor MP2 are different, the voltage rise rates at the node a and the node b are different after the time point ta.

At the time point tb, the NAND gate 322 is enabled to activate the control signal C according to the voltage difference at the nodes a and b. The NAND gate 322 generates the control signal C, which is equal to the ground voltage GND. Meanwhile, the switching transistor Msw is turned on. The node a and the node b are connected with each other. Consequently, the voltage at the node a and the voltage at the node b are equalized and gradually increased. At the time point tc, the voltage at the node a and the voltage at the node b are equal. In addition, the voltage at the node a and the voltage at the node b are gradually increased to the power supply voltage VDD2 at the same rise rate. Consequently, the NOT gate 210 generates an output signal OUT of the ground voltage GND corresponding to the low level state.

As mentioned above, if the level shifter 300 receives the invalid input signal IN and the invalid inverted input signal INB while the power supply voltage VDD2 is powered up, the continuously increased voltages at the node a and the node b enable the NAND gate 322 to activate the control signal C because of the difference between the charge currents generated by the first P-type transistor MP1 and the second P-type transistor MP2. Consequently, the switching transistor Msw is turned on. After the switching transistor Msw is turned on, the voltage at the node a and the voltage at the node b are equal. Then, the voltage at the node a and the voltage at the node b are gradually increased to the power supply voltage VDD2 at the same rise rate. Consequently, the NOT gate 210 generates the ground voltage GND corresponding to the low level state.

In other word, if the level shifter 300 receives the invalid input signal IN and the invalid inverted input signal INB while the power supply voltage VDD2 is powered up, the self-initialization circuit 320 can control the level shifter 300 to be maintained in a self-initializing power up state. Consequently, the output signal OUT has the specified voltage level, e.g., the ground voltage GND.

Figure 1A:
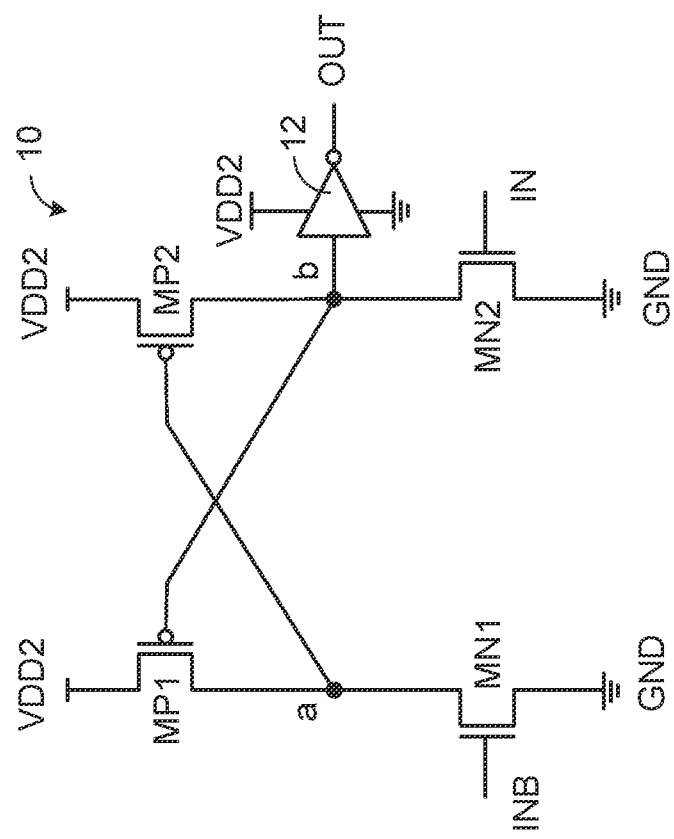
FIG. 1A (prior art) is a schematic circuit diagram illustrating a conventional level shifter in a normal working state.
Figure 1B:
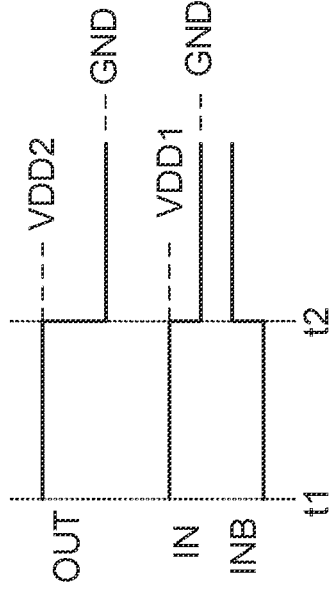
FIG. 1B (prior art) is a schematic timing waveform diagram illustrating associated signal processed by the conventional level shifter.
Figure 1C:
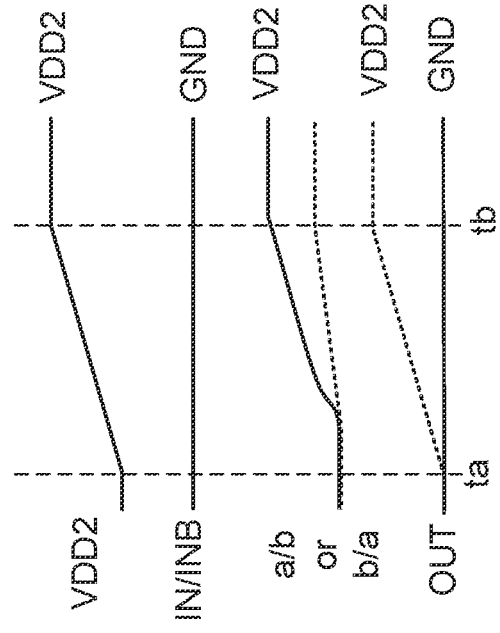
FIG. 1C (prior art) is a schematic timing waveform diagram illustrating associated signal processed by the conventional level shifter while the power supply voltage VDD2 is powered up.

When the level shifter 300 is in the normal working state, the voltage at the node a and the voltage at the node b are complementary levels. That is, one of the two voltages is the power supply voltage VDD2, and the other of the two voltages is the ground voltage GND. Consequently, the NAND gate 322 of the self-initialization circuit 320 will not activate the control signal C. Consequently, the switching transistor Msw is continuously turned off. The operation of the level shifter 300 is in the normal working state are similar to those of FIG. 1B, and not redundantly described herein.

Similarly, if the level shifter 300 receives the valid input signal IN and the valid inverted input signal INB while the power supply voltage VDD2 is powered up, the self-initialization circuit 320 will not activate the control signal C. According to the valid input signal IN and the valid inverted input signal INB, the level shifter 300 generates the output signal OUT.

From the above descriptions, if the level shifter 300 receives the invalid input signal IN and the invalid inverted input signal INB while the power supply voltage VDD2 is powered up, the node a and the node b are connected with each other under control of the self-initialization circuit 320. Consequently, the level shifter 300 generates the output signal OUT with the specified voltage level. Consequently, the unknown output problem in response to the invalid input will be overcome.

It is noted that the examples of the switch element in the self-initialization circuit are not restricted. For example, the P-type switching transistor Msw of the self-initialization circuit 320 is replaced by an N-type switching transistor Msw, and the logic circuit is correspondingly modified.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A level shifter for converting an input signal and an inverted input signal into an output signal, the input signal and the inverted input signal being in a range between a first power supply voltage and a ground voltage, the output signal being in a range between a second power supply voltage and the ground voltage, the level shifter comprising:
   a first P-type transistor, wherein a source terminal of the first P-type transistor receives the second power supply voltage, a drain terminal of the first P-type transistor is connected with a first node, and a gate terminal of the first P-type transistor is connected with a second node;
   a second P-type transistor, wherein a source terminal of the second P-type transistor receives the second power supply voltage, a drain terminal of the second P-type transistor is connected with the second node, and a gate terminal of the second P-type transistor is connected with the first node;
   a first N-type transistor, wherein a drain terminal of the first N-type transistor is connected with the first node, a source terminal of the first N-type transistor receives the ground voltage, and a gate terminal of the first N-type transistor receives the inverted input signal;
   a second N-type transistor, wherein a drain terminal of the second N-type transistor is connected with the second node, a source terminal of the second N-type transistor receives the ground voltage, and a gate terminal of the second N-type transistor receives the input signal;
   a first NOT gate, wherein an input terminal of the first NOT gate is connected with the second node, and an output terminal of the first NOT gate generate the output signal; and
   a self-initialization circuit connected between the first node and the second node,
   wherein the first N-type transistor and the second N-type transistor are turned off when the input signal and the inverted input signal are invalid,
   wherein the self-initialization circuit judges whether the input signal and the inverted input signal received by the level shifter are invalid according to a voltage at the first node and a voltage at the second node,
   wherein if the self-initialization circuit confirms that the input signal and the inverted input signal received by the level shifter are invalid, the first node and the second node are connected with each other under control of the self-initialization circuit, the voltage at the first node and the voltage at the second node are increased at the same rise rate, so that the output signal from the first NOT gate has a specified voltage level.

2. The level shifter as claimed in claim 1, wherein the level shifter further comprises a second NOT gate, wherein an input terminal of the second NOT gate is connected with the first node, and an output terminal of the second NOT gate generates an inverted output signal.

3. The level shifter as claimed in claim 1, wherein the self-initialization circuit comprises:
   a switch element, wherein a first terminal of the switch element is connected with the first node, a second terminal of the switch element is connected with the second node, and a control terminal of the switch element receives a control signal; and
   a logic circuit, wherein a first input terminal of the logic circuit is connected with the first node, a second input terminal of the logic circuit is connected with the second node, and an output terminal of the logic circuit generates the control signal.

4. The level shifter as claimed in claim 3, wherein the switch element is a P-type switching transistor, wherein a first drain/source terminal of the P-type switching transistor is connected with the first node, a second drain/source terminal of the P-type switching transistor is connected with the second node, and a gate terminal of the P-type switching transistor receives the control signal.

5. The level shifter as claimed in claim 4, wherein the logic circuit is a NAND gate, wherein a first input terminal of the NAND gate is connected with the first node, a second input terminal of the NAND gate is connected with the second node, and an output terminal of the NAND gate generates the control signal.

6. The level shifter as claimed in claim 3, wherein the switch element is an N-type switching transistor, wherein a first drain/source terminal of the N-type switching transistor is connected with the first node, a second drain/source terminal of the N-type switching transistor is connected with the second node, and a gate terminal of the N-type switching transistor receives the control signal.

* * * * *